US012520460B2

United States Patent
L'Ecuyer

(10) Patent No.: US 12,520,460 B2
(45) Date of Patent: Jan. 6, 2026

(54) PDU FOR A TEMPERATURE-CONTROLLED DATA CENTER

(71) Applicant: Charles L'Ecuyer, Edmonton (CA)

(72) Inventor: Charles L'Ecuyer, Edmonton (CA)

( * ) Notice: Subject to any disclaimer, the term of this patent is extended or adjusted under 35 U.S.C. 154(b) by 263 days.

(21) Appl. No.: 18/030,474

(22) PCT Filed: Oct. 5, 2021

(86) PCT No.: PCT/CA2021/051396
§ 371 (c)(1),
(2) Date: Apr. 5, 2023

(87) PCT Pub. No.: WO2022/178621
PCT Pub. Date: Sep. 1, 2022

(65) Prior Publication Data
US 2023/0389237 A1    Nov. 30, 2023

Related U.S. Application Data

(60) Provisional application No. 63/087,797, filed on Oct. 5, 2020.

(51) Int. Cl.
*H05K 7/20* (2006.01)
*H05K 7/14* (2006.01)

(52) U.S. Cl.
CPC ....... *H05K 7/20836* (2013.01); *H05K 7/1492* (2013.01); *H05K 7/20236* (2013.01); *H05K 7/20272* (2013.01); *H05K 7/20781* (2013.01)

(58) Field of Classification Search
CPC ............. H05K 7/20836; H05K 7/1492; H05K 7/20236; H05K 7/20272; H05K 7/20781
(Continued)

(56) References Cited

U.S. PATENT DOCUMENTS 6,813,897 B1    11/2004  Bash et al.
7,819,676 B1    10/2010  Cardoso et al.
(Continued)

FOREIGN PATENT DOCUMENTS

TW    201338326 A    9/2013

OTHER PUBLICATIONS

PDU81001 Switched Metered-By-Outlet PDU Series Datasheet, "https://dl4jz3rbrsfum.cloudfront.net/documents/CyberPower_DS_PDU81001.pdf", Cyber Power Systems (USA), Inc., available at least as early as May 7, 2020.
(Continued)

*Primary Examiner* — Anatoly Vortman
(74) *Attorney, Agent, or Firm* — Nathan V. Woodruff

(57) ABSTRACT

A power distribution unit (PDU) includes a main power inlet, a plurality of power receptacles, a network switch having a plurality of network connections, one or more sensor connection ports and a PDU controller. The network switch is connectable to an external network, and provides communication links between the external network and each of the plurality of network connections. The PDU controller is connected to the power receptacles, network switch, and the sensor connection ports. The PDU controller comprises a cooling system controller configured to control an external cooling system. The PDU controller receives sensor signals from the one or more connection ports, and the PDU controller is addressable by a remote computer device from the external network via the network switch, and is configurable by the remote computer device to interpret the sensor signals and implement at least one action based on the sensor signals.

12 Claims, 6 Drawing Sheets

(58) Field of Classification Search
USPC .................................................. 361/679.53
See application file for complete search history.

(56) References Cited

U.S. PATENT DOCUMENTS

| | | | | |
|---|---|---|---|---|
| 8,494,661 | B2* | 7/2013 | Ewing | G05F 1/66 |
| | | | | 702/62 |
| 8,543,714 | B2* | 9/2013 | Chan | G06F 1/28 |
| | | | | 709/229 |
| 9,219,353 | B2 | 12/2015 | Ewing et al. | |
| 9,537,522 | B2* | 1/2017 | Ewing | H04B 5/72 |
| 9,727,515 | B2* | 8/2017 | Whitney | H04L 67/141 |
| 10,082,857 | B1 | 9/2018 | Czamara et al. | |
| 10,156,987 | B1 | 12/2018 | Gutierrez et al. | |
| 10,296,278 | B2* | 5/2019 | Kuo | G09G 3/2096 |
| 10,424,886 | B1* | 9/2019 | Irons | H01R 13/46 |
| 10,916,934 | B2* | 2/2021 | Witkoe | H02B 1/21 |
| 10,985,537 | B2* | 4/2021 | Yang | H02B 1/24 |
| 11,296,467 | B2* | 4/2022 | Irons | H01R 27/02 |
| 12,075,589 | B2* | 8/2024 | Albright | G06F 13/409 |
| 2008/0093927 | A1* | 4/2008 | Ewing | H05K 7/1492 |
| | | | | 307/23 |
| 2010/0019575 | A1* | 1/2010 | Verges | H02J 3/14 |
| | | | | 307/38 |
| 2010/0198535 | A1* | 8/2010 | Brown | G01R 22/063 |
| | | | | 702/62 |
| 2010/0287390 | A1 | 11/2010 | Yu | |
| 2012/0024515 | A1 | 2/2012 | Wei | |
| 2012/0120559 | A1* | 5/2012 | Ewing | H02B 1/565 |
| | | | | 361/622 |
| 2012/0317428 | A1 | 12/2012 | Liu et al. | |
| 2013/0046410 | A1* | 2/2013 | Hsieh | H05K 7/20836 |
| | | | | 700/277 |
| 2014/0201559 | A1 | 7/2014 | Chang | |
| 2015/0236512 | A1* | 8/2015 | Whitney | G06F 13/4068 |
| | | | | 307/80 |
| 2017/0315950 | A1* | 11/2017 | Whitney | H05K 7/1492 |
| 2018/0294610 | A1* | 10/2018 | Lewis | H01R 27/02 |
| 2019/0025894 | A1* | 1/2019 | Best | H05K 7/1492 |
| 2019/0090383 | A1 | 3/2019 | Tufty et al. | |
| 2020/0093024 | A1 | 3/2020 | Enright et al. | |
| 2020/0296856 | A1* | 9/2020 | Byers | H05K 7/1491 |
| 2021/0007244 | A1 | 1/2021 | Nizinkiewicz | |
| 2021/0263572 | A1* | 8/2021 | Yildirim | H05K 7/183 |
| 2022/0117121 | A1* | 4/2022 | Heydari | H05K 7/20772 |

OTHER PUBLICATIONS

Eaton High Density rack PDU brochure, https://www.eaton.com/content/dam/eaton/products/backup-power-ups-surge-it-power-distribution/power-distribution-for-it-equipment/hd-rack-pdu/eaton-hd-pdu-brochure-BR155020EN.pdf, Eaton Corporation plc, available at least as early as May 7, 2020.

Eaton PDI PowerHub 2 Power Distribution Unit 400-1250kVa: Installation and Operation Manual, "https://www.eaton.com/content/dam/eaton/products/backup-power-ups-surge-it-power-distribution/power-distribution-for-it-equipment/pdi-powerhub-2-pdu/eaton-powerhub2-pdu-400-1125kva-164001123.pdf", Eaton Corporation plc, available at least as early as May 7, 2020.

HPE Modular Power Distribution Units (Zero-U/1U Modular PDUs) Quickspecs, "https://support.hpe.com/hpesc/public/docDisplay?docId=c04123438&docLocale=en_US", Hewlett Packard Enterprise Development LP, available at least as early as May 7, 2020.

High Current Power Distribution Unit Installation Guide, "https://www.trimminc.com/download/INS-767XXXXXXX.pdf", Trimm, Inc., available at least as early as May 7, 2020.

Modular Power Distribution Product Datasheet, "https://p3-inc.com/wp-content/uploads/2022/04/ModularPowerDistBrochure.pdf", Schneider Electric, available at least as early as May 7, 2020.

24-Port Gigabit Ethernet Switch with 12 Outlet PDU, 2 SFP Ports, "https://assets.tripplite.com/product-pdfs/en/nsug24c2.pdf", Eaton Corporation plc, available at least as early as May 7, 2020.

Raritan Smartsensors Datasheet, https://www.raritan.com/assets/ram/resources/data_sheets/raritan-smartsensor-datasheet.pdf, Legrand, available at least as early as May 7, 2020.

PX Intelligent Rack PDUs Datasheet, "https://www.raritan.com/assets/re/resources/data_sheets/RE-ds-PX-PDUs.pdf", Raritan, Inc., available at least as early as May 7, 2020.

"The Importance of Smart PDUs in Cryptocurrency Mining", Feb. 1, 2018, Tripp Lite, https://blog.tripplite.com/the-importance-of-smart-pdus-in-cryptocurrency-mining/.

* cited by examiner

PDU FOR A TEMPERATURE-CONTROLLED DATA CENTER

TECHNICAL FIELD

This relates to a power distribution unit (PDU), and in particular, a PDU used with a temperature-controlled data center, as well as a temperature-controlled data center.

BACKGROUND

Power distribution units (PDUs) are common in situations where stable, distributed power is required. One common application for PDUs is with data centers, which may be used for cryptocurrency mining operations or other applications that involve large amounts of data processing.

PDUs may be ad-hoc designs, rack-mounted, or stand-alone units with integrated power and communication controls. One example of a PDU is found in U.S. pregrant pub. no. 2013/0046410 (Hsieh et al.) entitled "Method for Creating Virtual Environmental Sensor on a Power Distribution Unit".

SUMMARY

According to an aspect, there is provided a data center, comprising a plurality of computer hardware units positioned within a chamber, the chamber having a fluid inlet; a cooling system comprising a fluid pump that circulates a cooling fluid into the fluid inlet of chamber; a cooling system controller that controls the cooling system, the cooling system controller being separate and distinct from the cooling system; one or more sensors for detecting at least a temperature within the chamber; and a power distribution unit (PDU) immediately adjacent to the plurality of computer hardware units. The PDU comprises a power inlet configured to connect to an external power source; a plurality of power receptacles connected to the plurality of computer hardware units and the cooling system, wherein, in use, the plurality of power receptacles distributes electrical power from the main power inlet to the plurality of computer hardware units and the cooling system; a network switch connected to each of the plurality of computer hardware units, wherein in use the network switch provides communication links between the plurality of computer hardware units and an external network; one or more sensor connection ports; and a PDU controller that is connected to control the plurality of power receptacles, the network switch, and the cooling system controller, the PDU controller being connected to receive sensor signals from the one or more sensor connection ports, the PDU controller being configurable to interpret the sensor signals and implement at least one action based on the sensor signals.

According to other aspects, the PDU controller may comprise the cooling system controller, and the PDU controller may be configured to control the cooling system based on the received sensor signals; the cooling system controller may comprise a motor controller for a motor of the cooling system; the PDU controller may be connected to the network switch and is addressable by a remote computer device to reconfigure the PDU controller; the PDU controller may be configured to selectively enable and disable one or more individual network connections, one or more sensor connection ports, or one or more of the plurality of power receptacles; the chamber may comprise a liquid bath, and the cooling fluid may be in a liquid phase in the liquid bath; the chamber may further comprise a cooling fluid outlet, and the cooling system may circulate the cooling fluid in a closed loop with a refrigeration unit; and the PDU may comprise a housing and a plurality of removable modules positioned within the housing.

According to an aspect, there is provided a power distribution unit (PDU), comprising: a main power inlet configured to connect to a power source; a plurality of power receptacles connected to receive electrical power from the main power inlet; a network switch having a plurality of network connections, the network switch being connectable to an external network, the network switch providing communication links between the external network and each of the plurality of network connections; one or more sensor connection ports; and a PDU controller connected to control the plurality of power receptacles and the network switch, and the one or more sensor connection ports, the PDU controller comprising a cooling system controller configured to control an external cooling system, wherein the PDU controller receives sensor signals from the one or more connection ports; the PDU controller is addressable by a remote computer device via the external network; and the PDU is configurable by the remote computer device to interpret the sensor signals and implement at least one action based on the sensor signals. The plurality of power receptacles may be configured to provide standardized electrical power.

According to another aspect, there is provided a method of controlling a temperature of a data center, the data center may comprise a plurality of computer hardware units positioned within a chamber, the chamber having a cooling fluid inlet that is connected to receive a cooling fluid from a cooling system, the method comprising the steps of installing a power distribution unit (PDU) immediately adjacent to the plurality of computer hardware units, the PDU comprising a power inlet, a plurality of power receptacles, a network switch, one or more sensor connection ports, and a cooling system controller; connecting the power inlet to an external power source and connecting the plurality of computer hardware units and the cooling system to the plurality of power receptacles such that the plurality of power receptacles distributes electrical power from the main power inlet to the plurality of computer hardware units and the cooling system; connecting the network switch to each of the plurality of computer hardware units such that the network switch provides communication links between the plurality of computer hardware units and an external network; connecting one or more sensor connection ports to receive sensor signals from the one or more sensors; causing PDU to monitor at least a temperature within the chamber via the one or more sensors; and configuring the PDU to control the plurality of power receptacles, the network switch, and the cooling system controller based at least partly on the sensor signals received by the PDU, the PDU being configured by connecting to the PDU using a remote computer device via the network switch.

According to other aspects, the PDU controller may be configured to control the cooling system based on the received sensor signals; the PDU controller may be configured to selectively enable and disable one or more individual network connections, one or more sensor connection ports, or one or more of the plurality of power receptacles; the chamber may comprise a liquid bath and the cooling fluid may be in a liquid phase in the liquid bath; the PDU may be immediately adjacent to the liquid bath; the chamber may further comprise a cooling fluid outlet, and the cooling system may circulate the cooling fluid in a closed loop with a refrigeration unit; and the PDU may comprise a housing and a plurality of removable modules positioned within the housing.

In other aspects, the features described above may be combined together in any reasonable combination as will be recognized by those skilled in the art.

BRIEF DESCRIPTION OF THE DRAWINGS

These and other features will become more apparent from the following description in which reference is made to the appended drawings, the drawings are for the purpose of illustration only and are not intended to be in any way limiting, wherein.

DETAILED DESCRIPTION OF PREFERRED EMBODIMENTS

Figure 1:
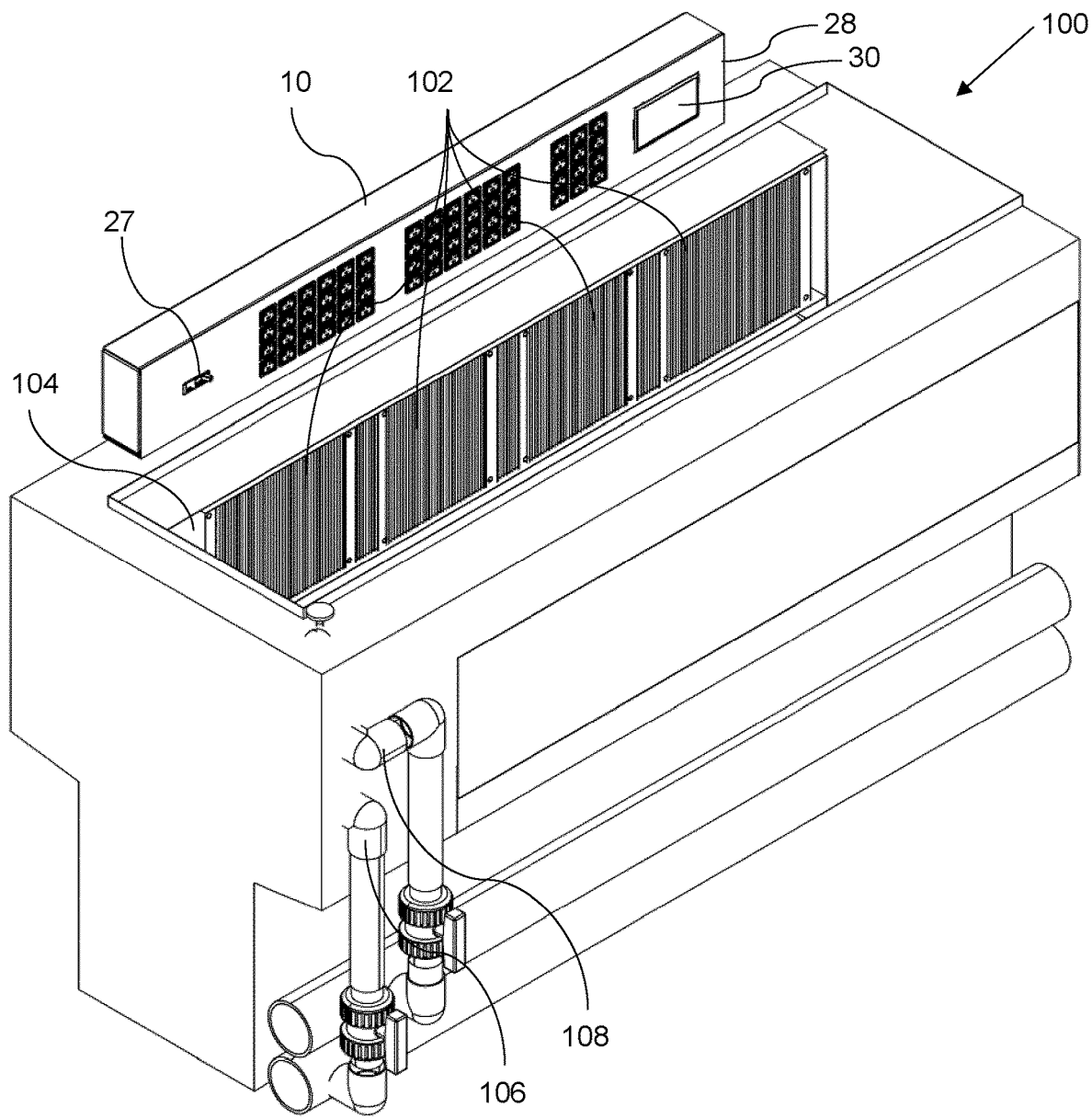
FIG. 1 is a perspective view of a data center and power distribution unit.

A power distribution unit (PDU), generally identified by reference numeral 10, and a data center generally identified by reference number 100, will now be described with reference to FIG. 1 through 4.

Figure 2:
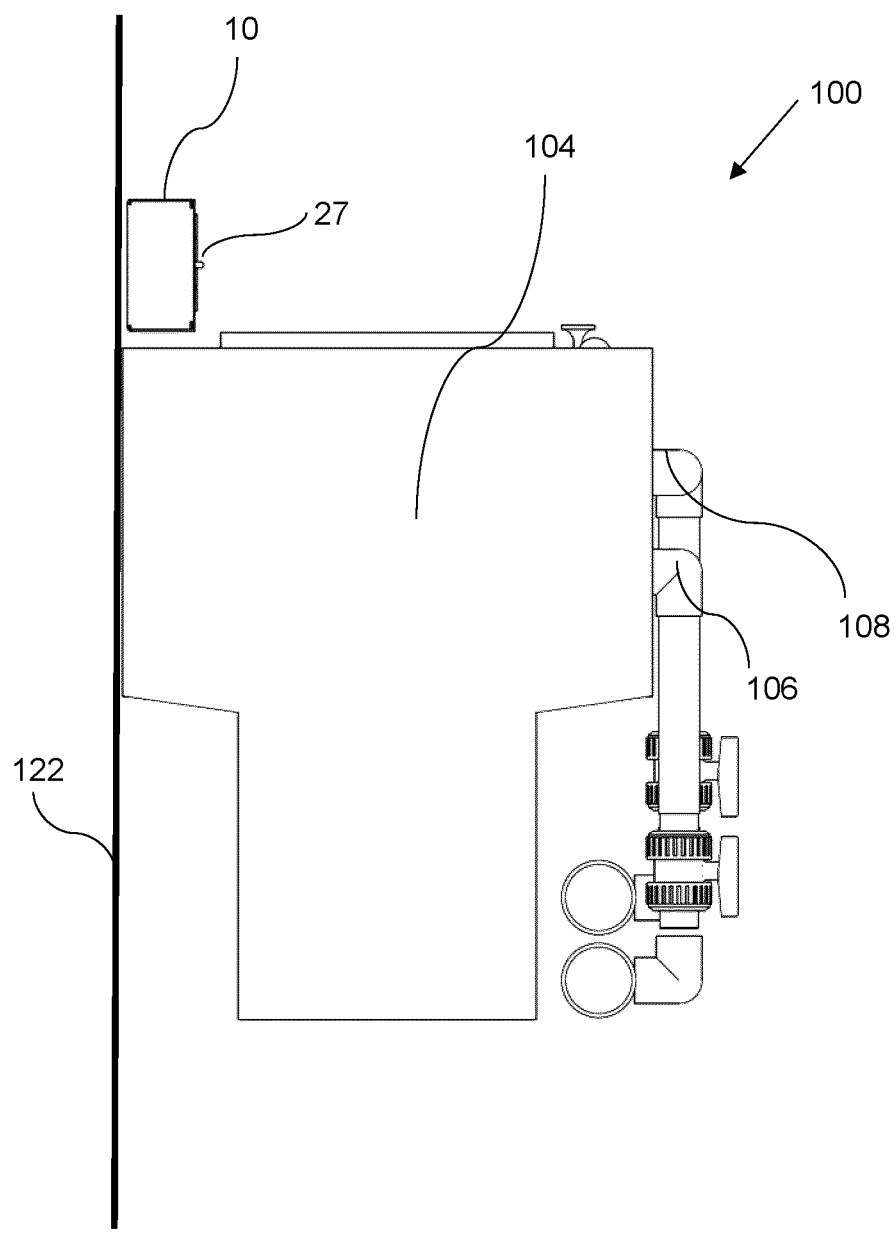
FIG. 2 is a side elevation view of a data center and power distribution unit.

Referring to FIGS. 1 and 2, data center 100 includes a plurality of computer hardware units 102 positioned within a chamber 104. The term "server" is used herein to refer generically to hardware components used to process data or support other components that process data. The type or configuration of computer hardware units 102 may vary depending on the requirements of a given application. Typical components may include a motherboard, processing unit, memory unit, power supply, communications unit, etc. and may also include other components, such as a video card, i/o ports, etc. These details will depend on the intended use of computer hardware units 102 the preferences of the user and will not be described further.

In the depicted example, computer hardware units 102 of data center 100 are liquid-cooled in chamber 104, which is a liquid bath that has a cooling fluid inlet 106 and a cooling fluid outlet 108. In this way, temperature-controlled liquid may be circulated through liquid bath 104 to maintain computer hardware units 102 within a desired temperature range, according to the specifications of a particular data center design. Other cooling systems may also be used, such as an air-cooled system that circulates temperature-controlled air through chamber 104, which may be a room. In a liquid-cooled system, the cooling circuit will typically be a closed-loop system, where warmed liquid is withdrawn via fluid outlet 108 and replaced with cooled liquid via fluid inlet 106. In other systems, the cooling circuit may be an open-loop system. For example, in an air-cooled system, the warmed air may be allowed to vent from 104 chamber without returning to the cooling system. In other examples, the cooling system may be a combination of liquid and air-cooled systems, where the cooling fluid cools the air within chamber 104 similar to a refrigerator.

Figure 3:
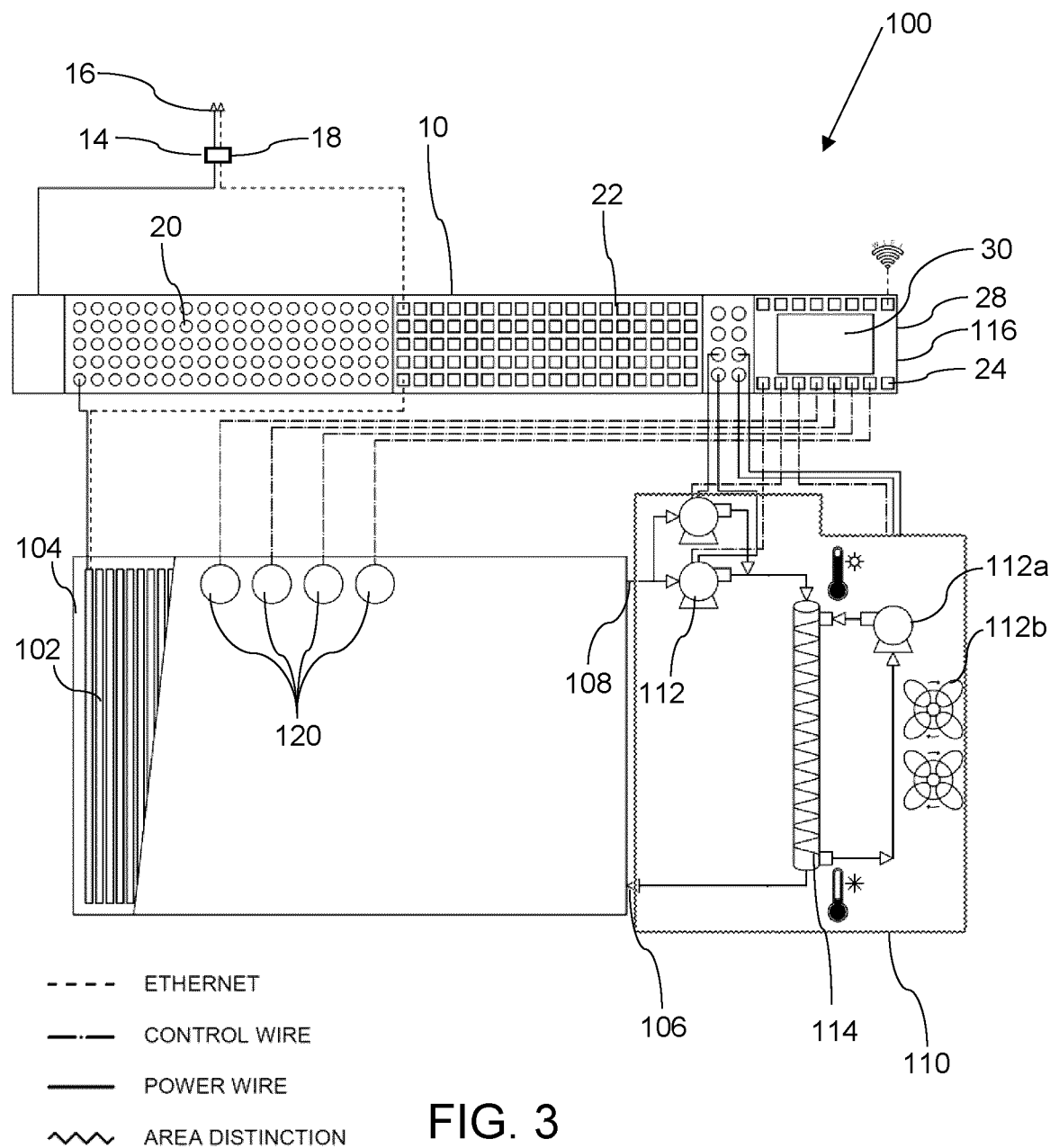
FIG. 3 is a schematic view of a data center and power distribution unit.

Referring to FIG. 3, a schematic of a cooling system 110 is shown, including a fluid pump 112 that circulates a cooling fluid into chamber 104 via fluid inlet 106 and returns warmed fluid from chamber 104 to fluid pump 112 via outlet 108. Cooling system 110 also includes a heat exchanger 114 to reduce the temperature of the cooling fluid. This may be, for example, an air-cooled heat exchanger, or may be a heat exchanger that is cooled by a refrigeration circuit and heat pump. As shown, cooling system 110 may include a circulating pump 112*a*, and fans 112*b* that work with heat exchanger 114 to cool the cooling fluid circulating through chamber 104. Various designs may be used to implement a controlled cooling system 110 and will not be discussed further.

Cooling system 110 is controlled by a cooling system controller 116 to regulate the temperature within chamber 104. Cooling system controller 116 is separate and distinct from cooling system 110. As shown, cooling system controller 116 is part of PDU 10 as will be discussed below. It will be noted that cooling system 110 may also have an internal controller (not shown) with some control functions used in regulating the operation of cooling system 110. As used herein, cooling system controller 116 refers to a unit that is separate and distinct from cooling system 110 and that exercises at least some monitoring and control functions relative to cooling system 110. It will be understood that the complexity of cooing system controller 116 will depend at least in part on whether an internal controller is present and its design. In one example, cooling system controller 116 may monitor the temperature within chamber 104 and send a control signal to cooling system 110 to increase or decrease the temperature. The internal controller of cooling system 110 may then implement the required temperature change by changing the speed of pump 112, changing the amount of cooling applied to the cooling fluid, etc. depending on the degree of change required and the current operating conditions. In another example, cooling system controller 116 may provide direct control over the fluid pump, heat exchanger, heat pump, etc. PDU controller 28 may also include a programmable PLC and I/O monitoring, HVAC power and control, etc.

Data center 100 also includes sensors 120 that are used to monitor various environmental and operational aspects. Sensors 120 may be used to monitor the fluid temperature within chamber 104, the ambient temperature within the room that houses chamber 104, a flow rate sensor that monitors the flow of cooling fluid, load sensors for pump 112, sensors that monitor the operation of PDU 10, environmental sensors such as for detecting for smoke, humidity, motion, lights, etc., or other sensors as may be useful in a given implementation.

Referring to FIGS. 1 and 2, PDU 10 is preferably installed immediately adjacent to plurality of computer hardware units 102. As shown in FIG. 2, PDU 10 is mounted above chamber 104 in which computer hardware units 102 are installed and on the same wall 122 to which chamber 104 is mounted. PDU 10 may be mounted using a wall mount bracket kit, or mounted to a rack such as a server rack such as by using a rack mount bracket kit, or may be positioned on the floor or on a shelf or stand. Alternatively, PDU may be mounted within chamber 104, and where possible, may be submerged if chamber 104 is a liquid bath. As will be understood, each installation may have different dimensions and configurations of the room in which PDU 10 and computer hardware units 102 are located, which will require modifications to the relative positions of the various components. As such, as used herein, "immediately adjacent"

means as close as practical, taking into account the structural limitations of the space in which PDU 10 and data center 100 are located, access requirements to computer hardware units 102, chamber 104, cooling system 110, etc, the power and communications connections between external sources and PDU 10, while minimizing the distance between PDU 10 and data center 100. The spacing between PDU 10 and computer hardware units 102 is able to be reduced relative to an ad-hoc system, for example, by combining the various elements of PDU 10 into a single housing as discussed below. PDU is preferably housed in a single housing made from metal, plastic, or other suitable material.

Figure 4:
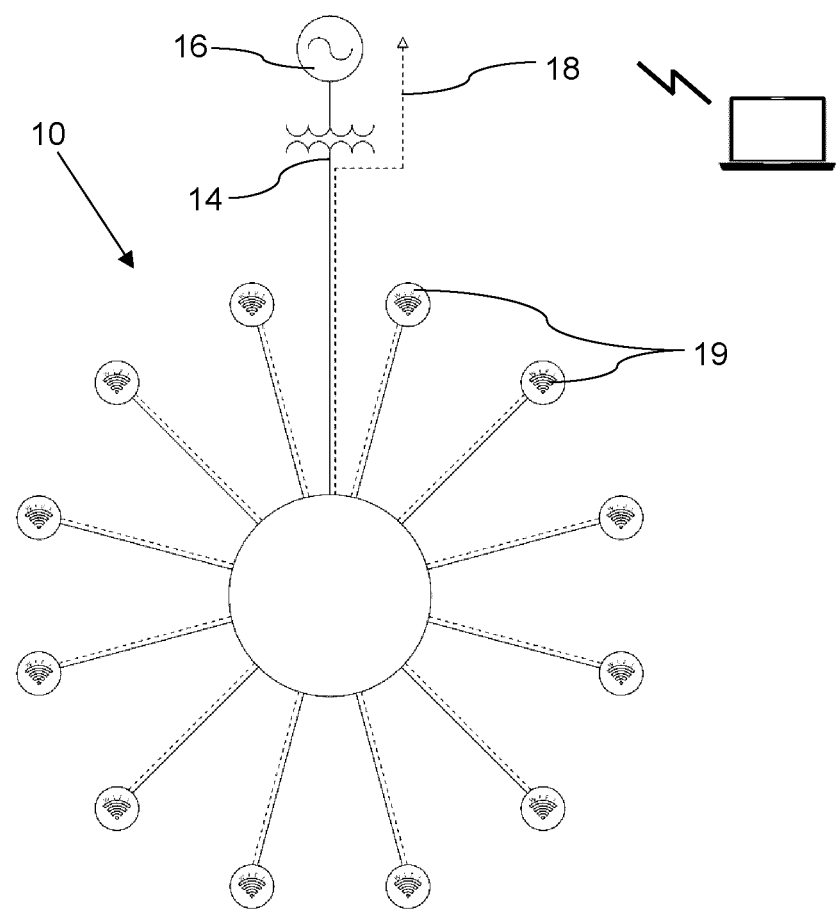
FIG. 4 is a schematic view of a power distribution unit.

Referring to FIG. 4, PDU 10 has a power inlet 14 configured to connect to an external power source 16, and a connection 18 to an external communications network. PDU 10 acts as a hub to distribute power and provide communication links 19 to individual computer hardware units 102 (not shown). Power inlet 14 may connect, for example, to a 415V external power source 16 using a L16-30 twist lock receptacle.

Referring to FIG. 3, one example of a PDU 10 includes a plurality of power receptacles 20, a network switch 22, sensor connection ports 24, a main breaker 27 (shown in FIG. 1), and a PDU controller 28, which is disposed within the housing of PDU 10. Power receptacles 20 may be standard power receptacles, such as 110 V or other standard voltages used by the equipment being powered, and are connected to power the various computer hardware units 102 and cooling system 110. Other equipment may also be connected to power receptacles if required. In some circumstances, cooling system 110 may be powered by a separate power source if data center 100 is being integrated into an existing building. As shown, PDU uses power receptacles 20 to distribute electrical power from external power source 16 to computer hardware units 102, and cooling system 110, any possibly other equipment, if required.

Network switch 22 is used to provide a communication link between an external network and some or all of the computer hardware units 102. The communication link may be a wired connection or a wireless connection. Network switch 22 may include a WIFI connection or interconnection with an individual IP address and may include a star network connection capability, via cellular or hardwired connection.

Sensor connection ports 24 are preferably standard ports and are used to connect to the various sensors used to monitor data center 100.

PDU controller 28 is connected to control power receptacles 20, network switch 22, and cooling system controller 116, which in the depicted example, is part of PDU controller 28. Connection to, and control over, cooling system controller 116 may be accomplished by integrating cooling system controller 116 into PDU controller 28. As sensor signals are received via sensor connection ports 24, PDU controller 28 interprets the sensor signals and is programmed to implement at least one action based on the sensor signals. This may include, for example, controlling cooling system 110 based on the received sensor signals, such as temperature readings, etc.

Preferably, PDU controller 28 may be configurable to work with a range of different sensors that are able to be connected to sensor connection ports 24 or that are able to connect wirelessly to PDU controller 28, a range of designs for cooling systems 110, and a range of designs for data center 100. This may be done by configuring PDU controller 28 to be addressable by a remote computer device using, for example, a standard communications protocol. Once connected, PDU controller 28 may be reconfigured to adapt to the particular equipment in use. In some examples, PDU controller 28 may be configured to selectively connect, disconnect, or otherwise manage one or more power receptacles 20, one or more network connections in network switch 22, or one or more sensor connection ports 24.

PDU controller 28 may also be configured to provide security system controls, to activate a fire alarm, or to send messages to a local fire department or security service based on readings from particular sensors.

PDU Examples

Referring to FIG. 1-3, in some examples, PDU 10 may be designed to have an amperage rating of between 150 A to 600 A with breaker 27 set accordingly, and with dimensions of 8 inches tall, 4 or 5 inches deep, and between 48 and 96 inches long. The amperage rating and the dimensions will generally relate to the number of receptacles 20. For example, a PDU 10 that is rated for 600 A and is 96 inches long may be provided with up to 180 receptacles (IEC-320-C19 outlets) with an output voltage of 240V single phase. Some receptacles 20 may be reserved as utility plugs, such as to power local lighting, a laptop, etc. in which case the rating may be 120V instead of 240V. Receptacle amp rating may be up to 90 receptacles rated @ 20 A-240V. PDU 10 may be connected to an external power source 16 providing 400-480 Volts 3 phase with an acceptable input voltage of about ±10% of nominal voltage and an input frequency of about 50/60 Hz.

PDU controller 28 may provide power monitoring, incoming phase monitoring, incoming power consumption monitoring, outlet power monitoring, and remote on/off capability. The input connection between power inlet 14 and external power source 16 may be a power distribution block (PDB), which may provide the ability to deport the PDU breaker protection.

Network switch 22 may be an ethernet 2×RJ45 network connection, or a 180-port switch at 1 Gbps.

PDU 10 may have a display screen 30, such as an LCD screen, to check the status of PDU 10 and/or provide a touch screen interface to monitor or change the settings.

Cooling system controller 116 may include one or two motor control starters, may include an integrated motor control for redundant pump motor system such as up to 5 HP (3 phase), and may provide motor overload protection for the motor being controlled.

Sensor connection ports 24 may be a remote I/O stackable, 12 channel Flex I/O control module.

Modular PDU

Figure 5:
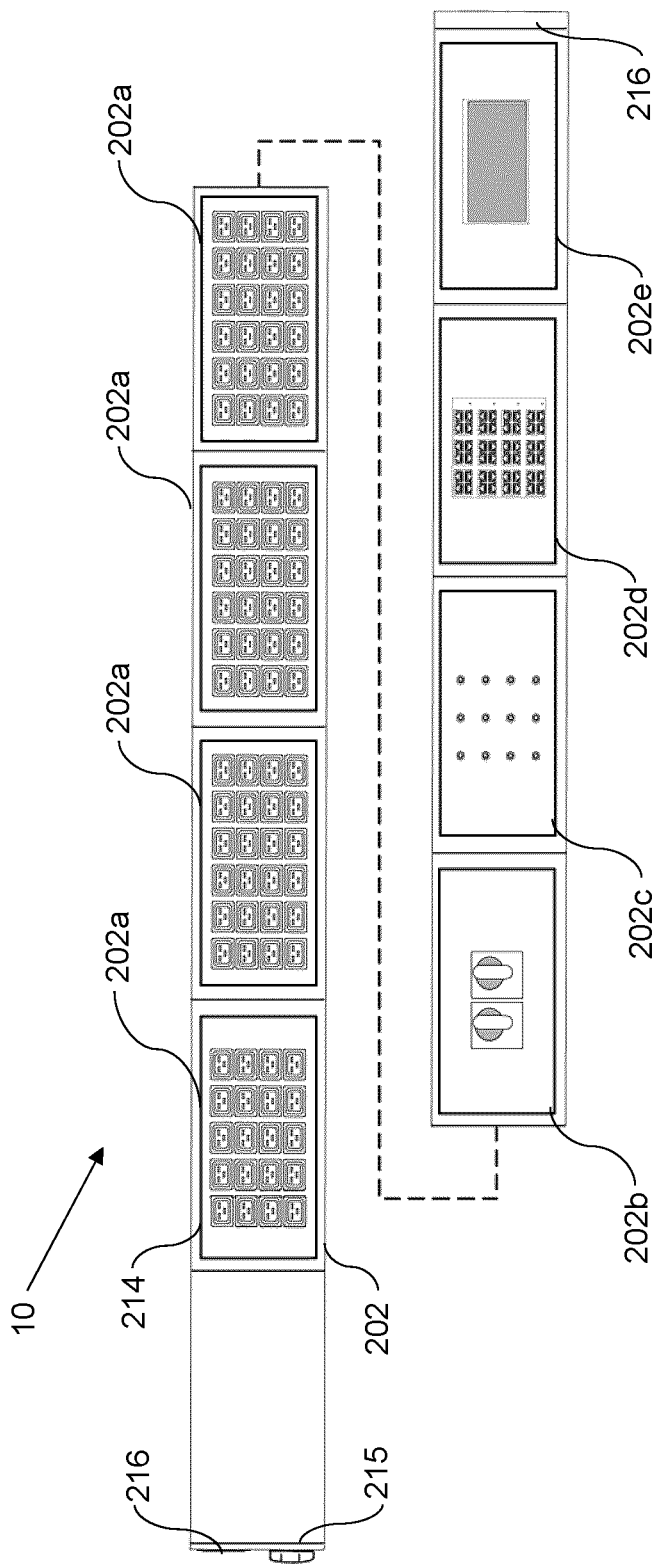
FIG. 5 is a front plan view of a modular power distribution unit.

Referring to FIG. 5, PDU 10 may be designed as a modular unit, where multiple modules 202 are installed and connected in series within a housing 204. In the depicted example, components 202 include multiple power receptacle modules 202a, a power control module 202b, an I/O flex module 202c, a network switch module 202d, and a touch screen module 202e. In other examples, there may be additional or fewer modules, and the type of modules may be selected according to requirements of a given implementation.

Figure 6:
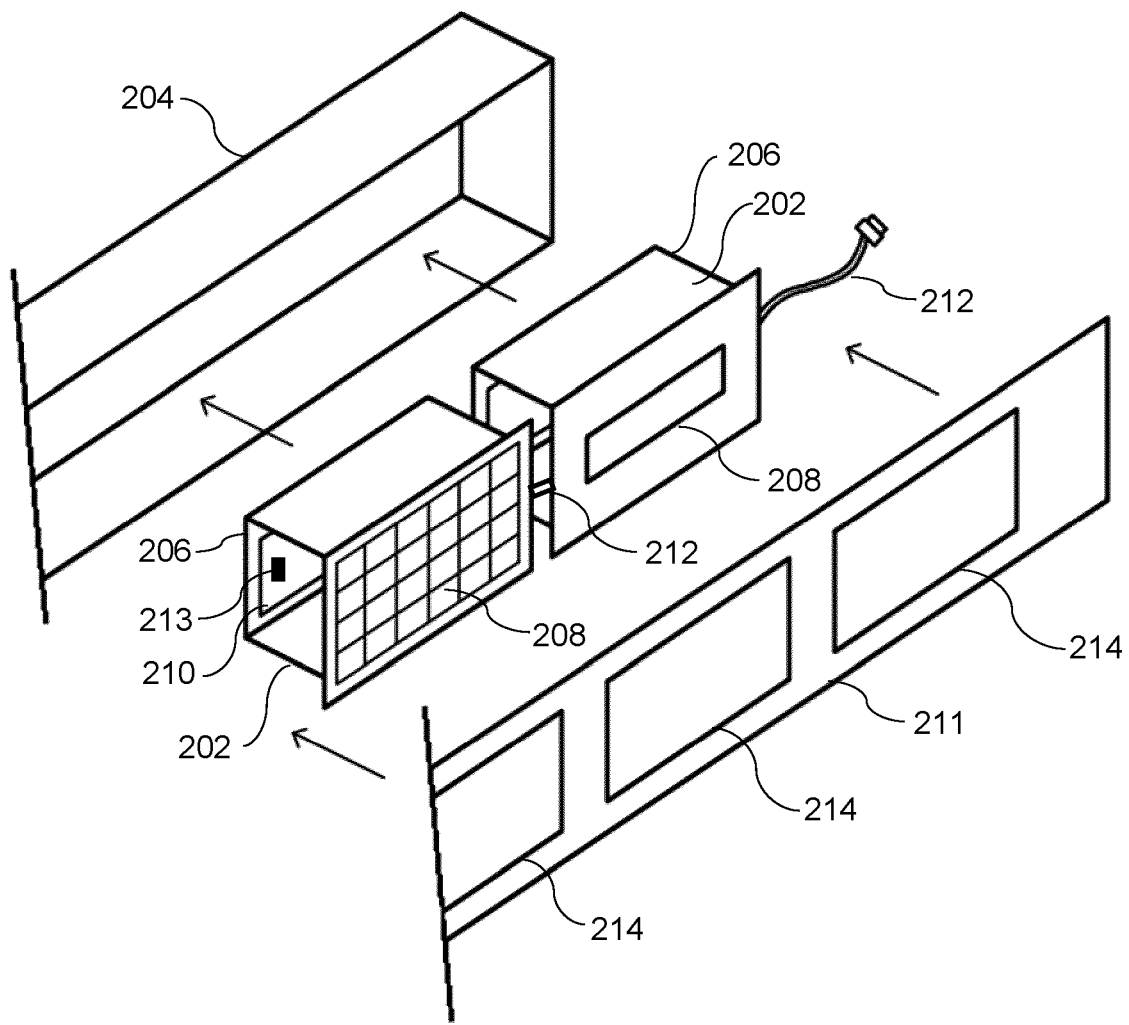
FIG. 6 is an exploded perspective view of a portion of a modular power distribution unit.

Referring to FIG. 6, each module 202 may be include a sub-housing 206 that carries a user interface 208, a PCB 210, and a wire connector 212. Modules 202 are designed such that user interfaces 208 are positioned within, and accessible through, openings 214 of housing 204 when installed. While different designs are possible, in the depicted example, openings 214 are positioned in a removable cover plate 211 that may be removed to provide access to modules 202. In other examples, modules 202 may be inserted through openings 214 from the outside, or removable cover plate 211 may be the top or back of housing 204 that provides access to the interior of housing 204. Each module 202 may have a corresponding user interface 208, such as a selected number of power receptacles, power or communications switches, touch screens, etc. Wire connector 212 allows adjacent modules to be connected together in series. In particular, each module 202 has a corresponding receptacle 213 that connects to the wire connector 212 of an adjacent module 202. Preferably, each connection allows for power and data communication, such that each module 202 is powered and monitored via connections 212. Referring to FIG. 5, as modules 202 are connected in series, the overall power and data cables connected to PDU 10 may be minimized and may be limited to one of each, such as via connection port 215. In some cases, a wireless connection, such as within network switch module 202d shown in FIG. 5, may be included that avoids the need for a wired connection to PDU 10. Wired connections may still be used between modules 202 within PDU 10.

Referring to FIG. 6, in order to facilitate airflow through housing 204, each sub-housing 206 may be open at either end. Referring to FIG. 5, this allows fans 216 to circulate air along the length of housing 204, such as by having a fan 216 at one end blowing air into housing 204, and another fan 216 pulling air from housing 204 at the other end.

While shown as having modules 202 in a single row, housing 204 may be designed with more than one row to accommodate specific space requirements.

By designing PDU 10 to be modular, PDU 10 may be customized by selecting the number and type of modules 202 and by selecting a housing 204 of a suitable length, or by designing housing 204 to be adjustable. In addition, PDU may be serviced in the event of a fault by removing and servicing or replacing an individual module 202. As the status of each module 202 may be monitored within PDU 10, as discussed above, faults in a given module 202 may be localized and addressed in a straightforward manner.

In this patent document, the word "comprising" is used in its non-limiting sense to mean that items following the word are included, but items not specifically mentioned are not excluded. A reference to an element by the indefinite article "a" does not exclude the possibility that more than one of the elements is present, unless the context clearly requires that there be one and only one of the elements.

The scope of the following claims should not be limited by the preferred embodiments set forth in the examples above and in the drawings, but should be given the broadest interpretation consistent with the description as a whole.

What is claimed is:

1. A data center, comprising:
   a plurality of computer hardware units positioned within a chamber, the chamber having a fluid inlet;
   a cooling system comprising a fluid pump that circulates a cooling fluid into the fluid inlet of the chamber;
   one or more sensors for detecting at least a temperature within the chamber; and
   a power distribution unit (PDU) immediately adjacent to the plurality of computer hardware units, the PDU comprising:
     a cooling system controller configured to control the cooling system;
     a power inlet configured to connect to an external power source;
     a plurality of power receptacles connected to the plurality of computer hardware units and the cooling system, wherein, in use, the plurality of power receptacles distributes electrical power from the power inlet to the plurality of computer hardware units and the cooling system;
     a network switch connected to each of the plurality of computer hardware units, wherein in use the network switch provides communication links between the plurality of computer hardware units and an external network;
     one or more sensor connection ports; and
     a PDU controller that is connected to control the plurality of power receptacles, the network switch, and the cooling system controller, the PDU controller being connected to receive sensor signals from the one or more sensor connection ports, the PDU controller being configured to interpret the sensor signals and implement at least one action based on the sensor signals, wherein the at least one action comprises causing the cooling system controller to control the cooling system.

2. The data center of claim 1, wherein the cooling system controller comprises a motor controller for a motor of the cooling system.

3. The data center of claim 1, wherein the PDU controller is connected to the network switch and is addressable by a remote computer device to reconfigure the PDU controller.

4. The data center of claim 1, wherein the PDU controller is configured to selectively enable and disable one or more of the communications links of the network switch, one or more sensor connection ports, or one or more of the plurality of power receptacles.

5. The data center of claim 1, wherein:
   the chamber comprises a liquid bath; and
   the cooling fluid is in a liquid phase in the liquid bath.

6. The data center of claim 5, wherein the chamber further comprises a cooling fluid outlet, and the cooling system circulates the cooling fluid in a closed loop with a refrigeration unit.

7. The data center of claim 1, wherein the PDU comprises a housing and a plurality of removable modules positioned within the housing.

8. A method of controlling a temperature of a data center, the data center comprising a plurality of computer hardware units positioned within a chamber, the chamber having a cooling fluid inlet that is connected to receive a cooling fluid from a cooling system, the method comprising the steps of:
   installing a power distribution unit (PDU) immediately adjacent to the plurality of computer hardware units, the PDU comprising a power inlet, a plurality of power receptacles, a network switch, one or more sensor connection ports, and a cooling system controller;
   connecting the power inlet to an external power source and connecting the plurality of computer hardware units and the cooling system to the plurality of power receptacles such that the plurality of power receptacles distributes electrical power from the power inlet to the plurality of computer hardware units and the cooling system;
   connecting the network switch to each of the plurality of computer hardware units such that the network switch provides communication links between the plurality of computer hardware units and an external network;
   connecting one or more sensor connection ports to receive sensor signals from one or more sensors;
   causing the PDU to monitor at least a temperature within the chamber via the one or more sensors; and
   configuring the PDU to control the plurality of power receptacles, to control the network switch, and to cause the cooling system controller to control the cooling system based at least partly on the sensor signals received by the PDU, the PDU being configured by a remote computer device connected to the PDU via the network switch.

9. The method of claim 8, wherein the PDU controller is configured to selectively enable and disable one or more of the communications links of the network switch, one or more sensor connection ports, or one or more of the plurality of power receptacles.

10. The method of claim 8, wherein:
the chamber comprises a liquid bath; and
the cooling fluid is in a liquid phase in the liquid bath.

11. The method of claim 10, wherein the chamber further comprises a cooling fluid outlet, and the cooling system circulates the cooling fluid in a closed loop with a refrigeration unit.

12. The method of claim 10, wherein the PDU comprises a housing and a plurality of removable modules positioned within the housing.

\* \* \* \* \*